(12) United States Patent
Wang

(10) Patent No.: US 9,055,673 B2
(45) Date of Patent: Jun. 9, 2015

(54) ELECTRONIC DEVICE HAVING FOLDABLE COVER

(71) Applicant: Zhongshan Innocloud Intellectual Property Services Co., Ltd., Zhongshan (CN)

(72) Inventor: Yuan-Ming Wang, Shenzhen (CN)

(73) Assignee: Zhongshan Innocloud Intellectual Property Services Co., Ltd., Zhongshan (CN)

( * ) Notice: Subject to any disclaimer, the term of this patent is extended or adjusted under 35 U.S.C. 154(b) by 132 days.

(21) Appl. No.: 13/890,256

(22) Filed: May 9, 2013

(65) Prior Publication Data

US 2013/0301194 A1 Nov. 14, 2013

(30) Foreign Application Priority Data

May 10, 2012 (CN) .......................... 2012 1 0143100

(51) Int. Cl.
*G06F 1/16* (2006.01)
*H05K 5/02* (2006.01)
*H05K 5/03* (2006.01)

(52) U.S. Cl.
CPC ................ *H05K 5/0221* (2013.01); *H05K 5/03* (2013.01)

(58) Field of Classification Search
USPC .......... 439/331, 76.1, 824, 73, 372, 330, 517, 439/71, 264, 144; 455/575.8, 566, 575.1, 455/575.4, 575.3, 550.1, 41.1, 575.6, 455/556.1; 361/679.58, 679.01, 679.6, 361/679.31, 679.37, 679.33, 679.55, 679.2, 361/679.47, 679.34, 679.04, 679.02, 361/679.26, 679.56; 206/511, 379, 372, 206/308.1, 313, 1.5, 308.3, 232; 312/223.2, 312/333, 236, 284, 317.3, 163, 334.1, 227, 312/265; 248/317, 316.4
See application file for complete search history.

(56) References Cited

U.S. PATENT DOCUMENTS

| 7,656,663 | B2 * | 2/2010 | Zhao et al. ................ 361/679.58 |
| 8,009,424 | B2 * | 8/2011 | Zhu et al. ................. 361/679.58 |
| 8,404,373 | B2 * | 3/2013 | Dong .............................. 429/97 |

* cited by examiner

*Primary Examiner* — Hung Duong
(74) *Attorney, Agent, or Firm* — Novak Druce Connolly Bove + Quigg LLP

(57) ABSTRACT

A folding and latching electronic device includes a base and an elastic tab including a first latching portion and a cover rotatably connected to the base and defining a latching arm A second latching portion protrudes from a free end of the latching arm. The cover is rotatable relative to the base between an open position and a closed position where the latching arm is inserted into the receptacle, and the second latching portion is engaged with the first latching portion.

9 Claims, 6 Drawing Sheets

ELECTRONIC DEVICE HAVING FOLDABLE COVER

BACKGROUND

1. Technical Field

The present disclosure relates to electronic devices, and particularly to, an electronic device having a foldable cover with a latching mechanism.

2. Description of Related Art

Many folding and latching electronic devices include a base and a cover that is rotatably connected to the main base, such as portable optical disc players and notebook computers. In such folding and latching electronic devices, there is a need to lock the cover to the main base. Although conventional connection mechanisms can meet basic needs, it is still desirable and useful to provide a folding and latching electronic device with a new connection mechanism for locking the cover to the main base.

BRIEF DESCRIPTION OF THE DRAWINGS

The components in the drawings are not necessarily drawn to scale, the emphasis instead being placed upon clearly illustrating the principles of the present disclosure. Moreover, in the drawings, like reference numerals designate corresponding sections throughout the several views.

DETAILED DESCRIPTION

The disclosure, including the accompanying, is illustrated by way of example and not by way of limitation. It should be noted that references to "an" or "one" embodiment in this disclosure are not necessarily to the same embodiment, and such references mean "at least one."

Figure 1:
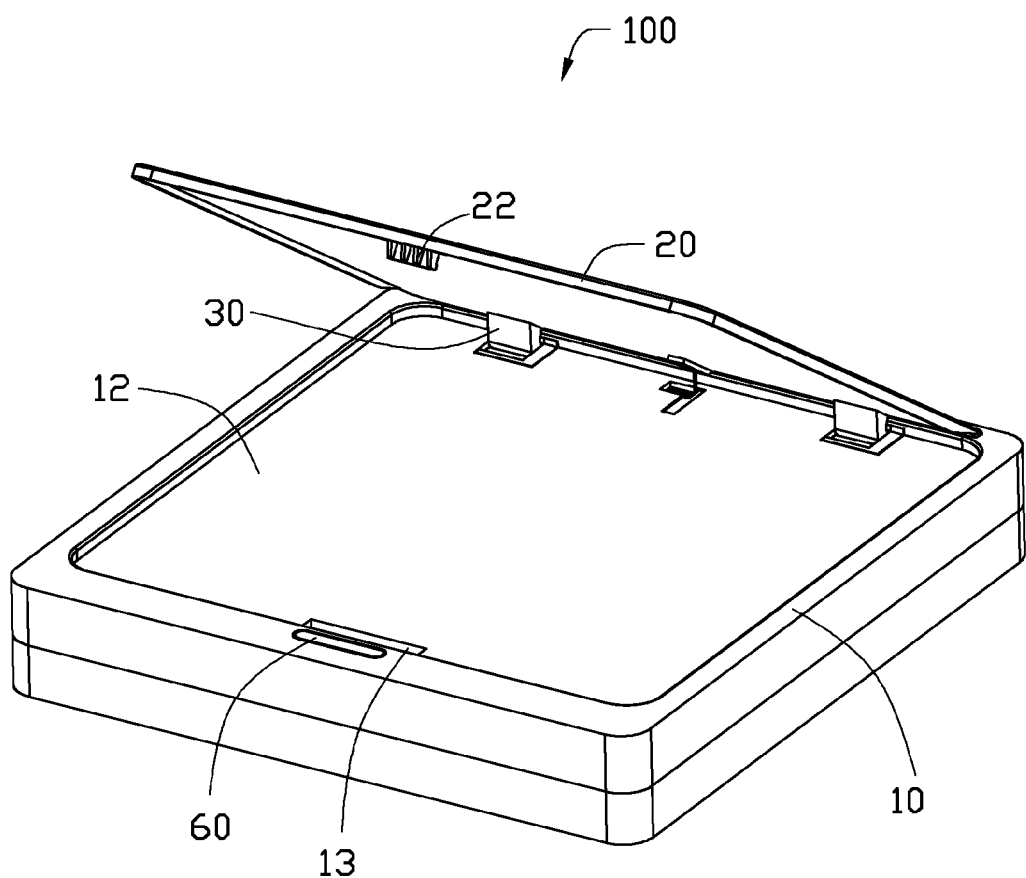
FIG. 1 is an isometric view of a folding and latching electronic device, with a cover opened, in accordance with an exemplary embodiment.
Figure 2:
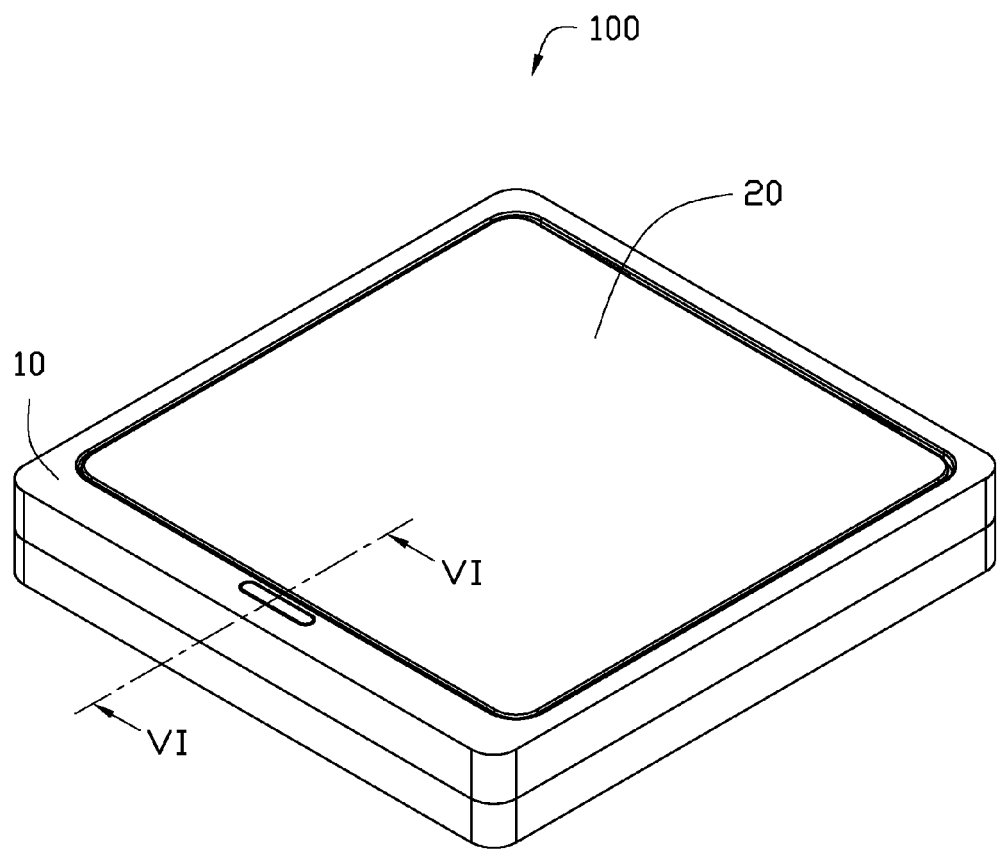
FIG. 2 is an assembled, isometric view of a latching mechanism of the folding and latching electronic device of FIG. 1.

Referring to FIGS. 1 and 2, a folding and latching electronic device 100 of one embodiment is shown. The folding and latching electronic device 100 includes a base 10, a cover 20, a connection mechanism 30, and a driving member 60. The connection member 30 rotatably connects the main base 10 to the cover 20. In the embodiment, the connection member 30 includes a pivot portion (not labeled) that is integrally formed with the cover 20, and rotatably received in a hole (not shown) of the main base 10, which rotatably connects the cover 10 to the main base 20. In this embodiment, the folding and latching electronic device 100 is an optical disc player.

A recess 12 is defined in a top surface 11 of the cover 20 facing the base 10, and for receiving the cover 11. An receptacle 13 is defined in the bottom of the recess 12 at one end opposite to the connection member 30.

Figure 3:
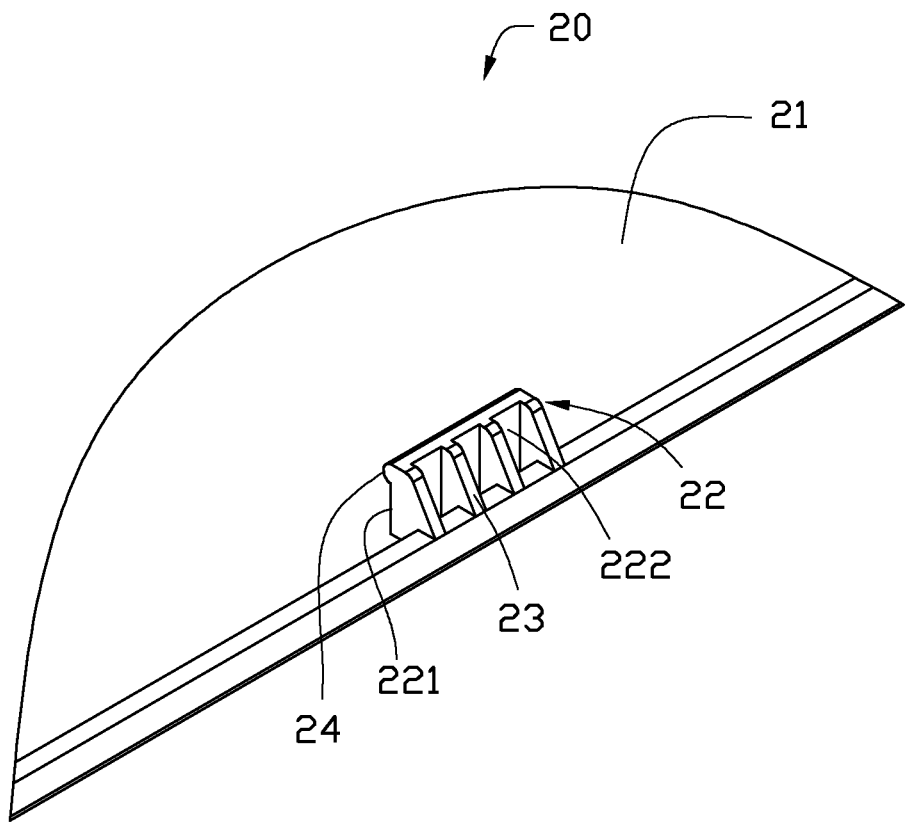
FIG. 3 is a partial enlarged view of a clasper of the latching mechanism of the folding and latching electronic device of FIG. 1.

Referring to FIG. 3, the cover 20 includes a bottom surface 21 facing the base 10, and a latching arm 22 protruding vertically from the bottom surface 21. The position of the latching arm 22 corresponds to the position of the receptacle 13, and the latching arm 22 is received in the receptacle 13 when the cover 10 is received in the recess 12 of the base 10. The latching arm 22 includes a first side 221 and a second side 222. A number of ribs 23 are arranged on the second side 222 for enhancing the tensile strength and fracture resistance of the latching arm 22. A second latching portion 24 protrudes from the first surface 221 facing the connection member 30. In this embodiment, the second latching portion 24 is arranged on the free end of the latching arm 22 and has a curved side surface.

Figure 4:
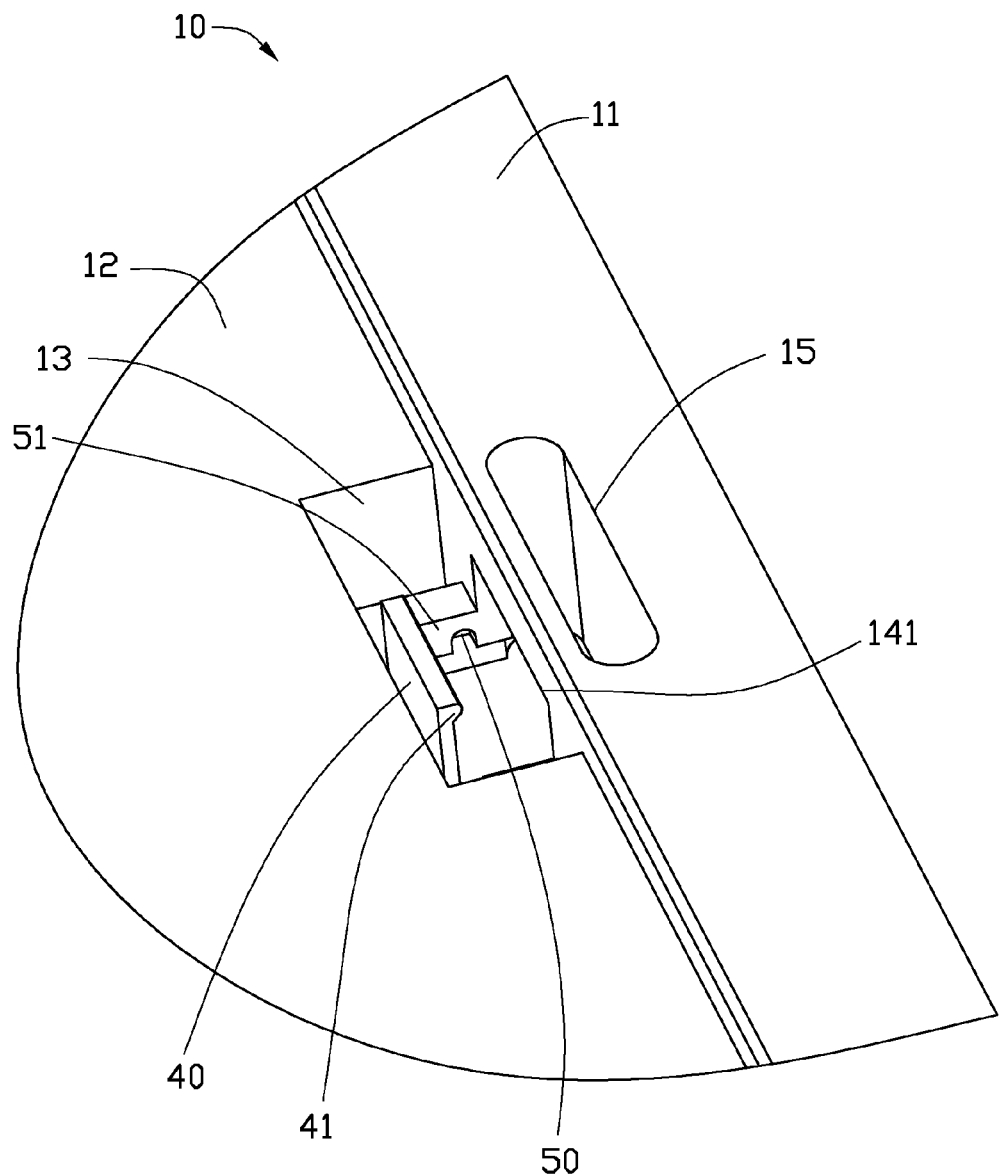
FIG. 4 is a partial enlarged view of an receptacle of the latching mechanism of the folding and latching electronic device of FIG. 1.

Referring to FIG. 4, the base 10 includes a groove 15 defined in the top surface 11 of the base 10, and located beside the receptacle 13 away from the connection member 30. A through hole 141 is defined in an inner wall between the groove 15 and communicating with the groove 15 and the receptacle 13. An elastic tab 40 protrudes from a bottom surface of the receptacle 13. The elastic tab 40 includes a first latching portion 41 protruding from the free end of the elastic tab 40 facing the second latching portion 24, and the first latching portion has a curved side surface. A pair of support portions 51 are arranged between the elastic tab 40 and the through hole 141 in the receptacle 13, and each of the two support portions 51 facing each other includes a hole 50. The elastic tab 40 is made of elastic material, such as plastic.

Figure 5:
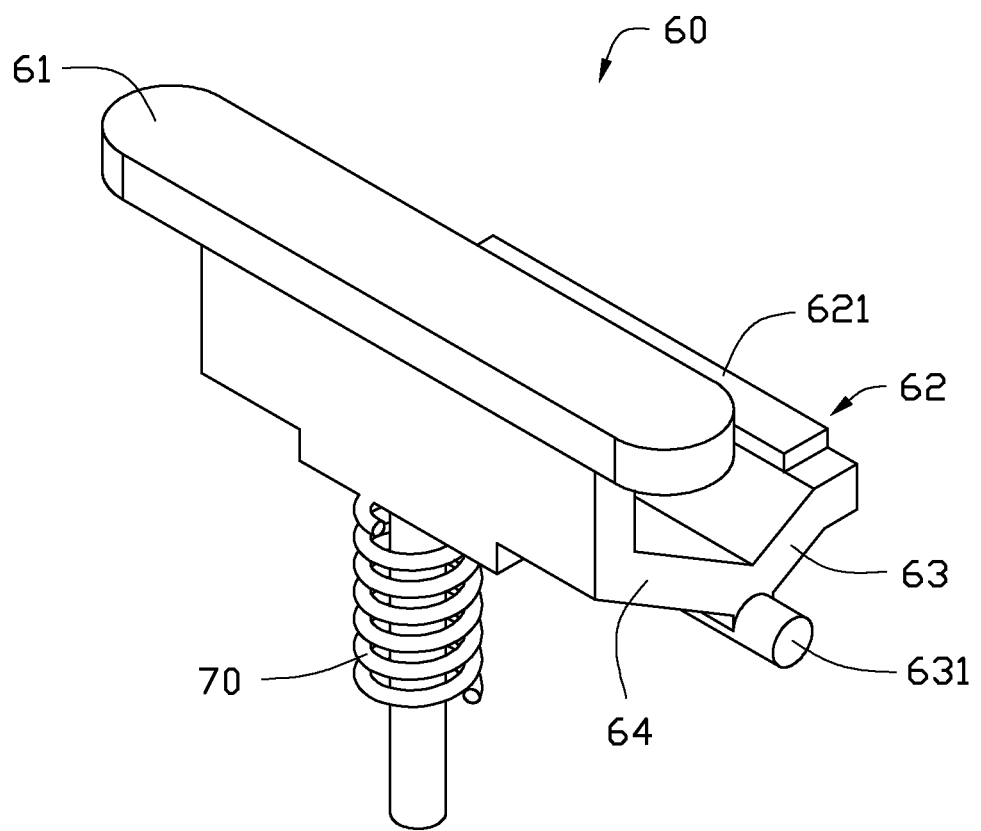
FIG. 5 is a schematic view showing a driving member of the latching mechanism of the folding and latching electronic device of FIG. 1.

Referring to FIGS. 4 and 5, the driving member 60 includes a pressing portion 61, a driving portion 62 and a shaft portion 63. The pressing portion 61 is connected to the driving portion 62 via a V-shaped connecting portion 64, and the shaft portion 63 is arranged on the bottom of the connecting portion 64. The pressing portion 61 and the driving portion 62 are located at opposite ends of the connecting portion 64. A spring 70 is arranged between the pressing portion 61 and a bottom of the groove 15. Opposite ends 631 of the shaft portion 63 are rotatably received in the holes 50 of the support portions 51. The driving portion 62 of the driving member 60 is accommodated in the receptacle 13. The connecting portion 64 of the driving member 60 passes through the through hole 141 and the pressing portion 62 is accommodated in the groove 15. In this embodiment, the pressing portion 62 is accessible through the open end of the groove 15. A resisting portion 621 is arranged on the top of the driving portion 62. The resisting portion 621 is made of elastic material or non-brittle material, such as rubber.

Figure 6:
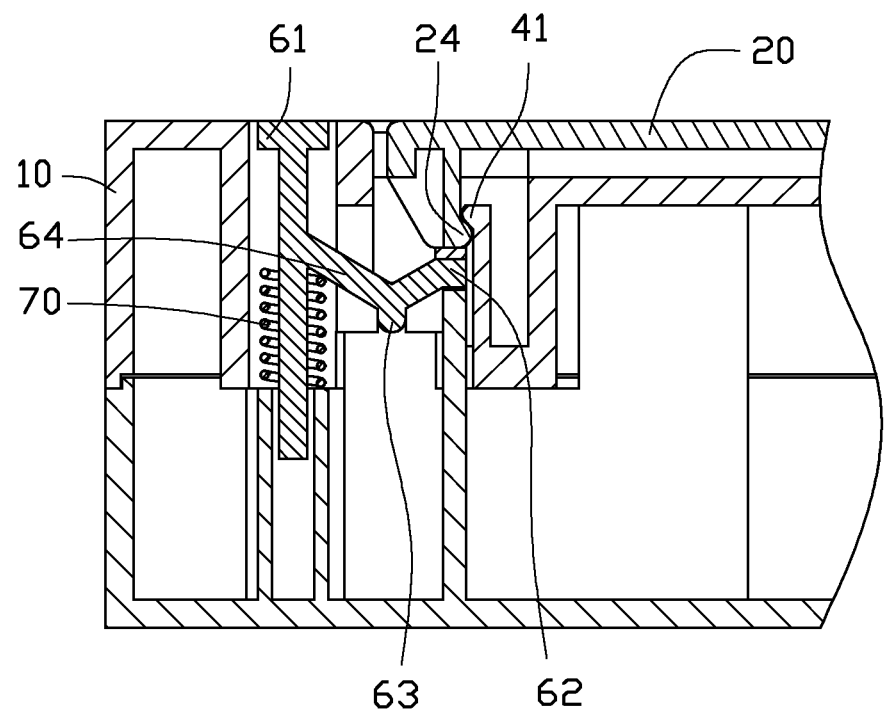
FIG. 6 is a schematic, cross-sectional view taken along line VI-VI of FIG. 1.

Referring to FIG. 6, during the closing of the cover 20, the latching arm 22 moves into the receptacle 13, and the end of second latching portion 24 contacts the end of the first latching portion 41. The elastic tab 40 is then forced by the latching arm 22 and deflects elastically, allowing the latching arm 22 to keep moving downwardly. When the cover 20 is accommodated in the recess 12, the elastic tab 40 restores, causing the second latching portion 24 to resist against the first latching portion 41 firmly, thereby retaining the cover 20 at the closed position.

To open the cover 20, a user needs to press the pressing portion 61 of the driving member 60. Because of the two ends of the shaft portion 63 are received in the holes 50 of the support portions 51, the downward move of the pressing portion 61 caused by the user causes the driving member 60 to rotate. The driving portion 62 moves upward and applies a pushing force to the second latching portion 24. The second latching portion 24 moves upward, which causes the elastic tab 40 to deflect. When the second latching portion 24 is disengaged from the first latching portion 41, the cover 20 is free to open to any desired position. The spring 70 restores the pressing portion 61 to its normal position after the pressing by the user has ceased.

With such configuration, the tensile strength and fracture resistance of the latching arm 22 is enhanced by the number of ribs 23. By using the elastic tab 40, the first latching portion 41 releases free from the second latching portion 24 when the cover 20 is pulled open without the driving of the driving member 60, thus protecting the latching arm 22.

Although the present disclosure has been specifically described on the basis of the embodiments thereof, the disclosure is not to be construed as being limited thereto. Various changes or modifications may be made to the embodiments without departing from the scope and spirit of the disclosure.

What is claimed is:

1. An electronic device comprising:
   a base defining a receptacle, the base comprising an elastic tab protruding from a bottom of the receptacle, the elastic tab comprising a first latching portion at a free end thereof;
   a cover rotatably connected to the base, and the cover comprising a bottom surface and a latching arm protruding from the bottom surface of the cover, and a second latching portion protruding from a free end of the latching arm for engaging with the first latching portion;
   wherein the cover is rotatable relative to the base between an open position and a closed position where the latching arm is inserted into the receptacle, and the second latching portion is engaged with the first latching portion.

2. The electronic device as described in claim 1, wherein each of the first latching portion and the second latching portion includes a curved surface.

3. The electronic device as described in claim 1, wherein a plurality of ribs are arranged on a side surface of the latching arm.

4. The electronic device as described in claim 1, further comprising a pivot shaft, wherein the base is rotatably connected to the cover via the pivot shaft.

5. The electronic device as described in claim 1, wherein
   a groove is defined in a top surface of the base adjacent to the receptacle, a through hole is defined in an inner wall between the groove and the receptacle and communicates with the groove and the receptacle;
   two support portions are arranged in the receptacle between the elastic tab and the through hole, each of the two support portions defining a hole;
   the electronic device further comprises a driving member comprising a pressing portion, a driving portion and a shaft portion located between the pressing portion and the driving portion;
   wherein opposite ends of the shaft portion are rotatably received in the holes of the support portions, the driving member is accommodated in the receptacle and abuts against the second latching portion when the cover is in the closed position.

6. The electronic device as described in claim 5, further comprising a connection portion, wherein the pressing portion is connected to the driving portion via the connecting portion, and the shaft portion is arranged on a bottom of the connecting portion, the pressing portion and the driving portion are located at opposite sides of the connecting portion.

7. The electronic device as described in claim 5, wherein a spring is arranged between the pressing portion and a bottom of the groove.

8. The electronic device as described in claim 5, wherein a resisting portion is arranged on the top of the driving portion.

9. The electronic device as described in claim 8, wherein the resisting portion is made of robber.

* * * * *